April 5, 1966 I. F. BARDITCH ETAL 3,244,995

AMPLIFIER INCLUDING A COMMON EMITTER AND COMMON COLLECTOR TRANSISTOR PROVIDING REGENERATIVE FEEDBACK

Filed July 7, 1961

United States Patent Office 3,244,995

Patented Apr. 5, 1966

3,244,995

AMPLIFIER INCLUDING A COMMON EMITTER AND COMMON COLLECTOR TRANSISTOR PROVIDING REGENERATIVE FEEDBACK

Irving F. Barditch, Baltimore, Md., and Robert Bento, Tiverton, R.I., assignors to Westinghouse Electric Corporation, East Pittsburgh, Pa., a corporation of Pennsylvania Filed July 7, 1961, Ser. No. 122,457

5 Claims. (Cl. 330—19)

This invention relates to improvements in semiconductor devices which may be used as amplifiers or oscillators, and more particularly to an improved semiconductor circuit which utilizes the phase shift inherent in a transistor due to the collector transition capacitance to provide the necessary phase shift for the generation of oscillations, or the necessary phase shift to provide positive feedback at a certain frequency and hence an effect similar to that of a tuned amplifier.

In prior art inductorless tuned amplifiers or oscillators it has usually been necessary to insert a phase shifting device or a frequency sensitive variable impedance network in a closed loop including a grounded emitter transistor and an emitter follower transistor, or possibly a grounded emitter transistor only. Such prior art devices when constructed in monolithic form require that a p-n junction be fabricated in the monolith separate from the two transistors, the p-n junction providing for phase shift, or providing the effect of a frequency sensitive and frequency selective network. The necessity for this additional p-n junction increases the complexity of the monolith.

The apparatus, circuit or device of the instant invention overcomes this and other disadvantages of the prior art. In summary, the apparatus of the instant invention has the collector of a grounded-emitter transistor stage connected directly to the base of the output emitter follower stage. The two transistors provide the necessary 360 degree phase shift to provide for positive feedback at the frequency to be amplified. The "tuning" frequency is determined in large part by the values of the collector capacitance of the transistors, and since these capacitances are a function of the collector-to-base potential difference, the tuning point may be varied by adjusting the collector biases within the transistor operating range.

Accordingly, a primary object of the invention is to provide a new and improved semiconductor oscillator or amplifier. The transition from oscillator to tuned amplifier may be carried out by decreasing the gain past a critical value.

Another object is to provide a new and improved semiconductor oscillator in which the phase shift inherent in transistors is utilized to provide the necessary in-phase feedback for the generation of oscillations.

A further object is to provide a new and improved semiconductor tuned amplifier in which the phase shift in the internal base-to-collector capacitance of the transistors is utilized to provide a frequency selective or frequency sensitive feedback path whereby positive feedback is obtained for a signal of the desired frequency, producing the effect of a tuned amplifier.

These and other objects will become more clearly apparent after a study of the following specification, when read in connection with the accompanying drawings, in which.

Figure 1:
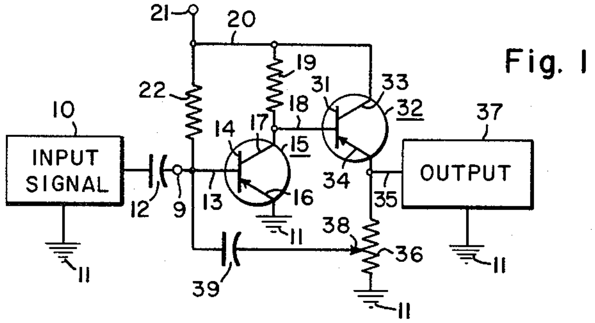
FIGURE 1 is a schematic equivalent electrical diagram of the amplifier device.
Figure 2:
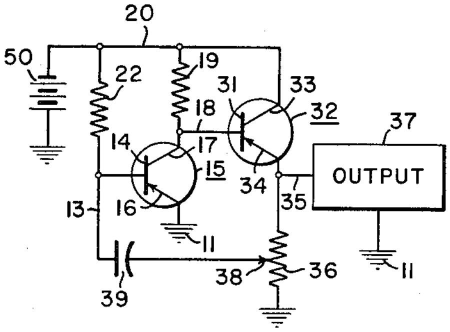
FIG. 2 is a schematic equivalent electrical circuit diagram of an oscillator according to the invention.

It will be understood that in accordance with semi-conductor engineering techniques the two transistors, resistors, capacitors and leads of the circuits of FIGS. 1 and 2 may be suitably doped regions in a single block of intrinsic semiconductor material, to provide the desired circuit functions.

In FIG. 1 there is shown an arrangement in which the invention is used as an amplifier. A similar circuit may be used as an oscillator as in FIG. 2 where the separate input signal source is dispensed with, as will become more clearly apparent hereinafter. The source of an input signal to be amplified, generally designated 10, in FIG. 1, develops an output signal with respect to ground 11 which is applied through capacitor 12 and lead 13 to the base 14 of a triode transistor generally designated 15. The transistor 15 has an emitter 16 connected to ground 11 and a collector 17 connected by way of resistor 19 and lead 20 to the terminal 21 of a suitable source of direct current energizing and biasing potential, not shown, of selected polarity to provide a reverse bias on the collector bias junctions, the biasing source having the other terminal thereof connected to ground 11. Lead 20 has resistor 22 connected therefrom to lead 13 for applying a biasing potential to the base 14 to properly bias the collector 17 and emitter 16 with respect to the aforementioned base 14. Collector 17 is connected through lead 18 directly to the base 31 of a transistor generally designated 32 which has the collector 33 thereof connected to the aforementioned lead 20 and the emitter 34 thereof connected by way of lead 35 and potentiometer 36 to ground 11. Lead 35 and emitter 34 are connected to an output or utilization device generally designated 37, for applying an output signal with respect to ground 11 to device 37. The arm 38 of the potentiometer 36 is connected by way of capacitor 39 to the aforementioned lead 13.

In understanding the operation of the circuit of FIG. 1, it should be noted that the resistance values of resistors 19 and 22 are chosen with respect to each other so that the voltage drops across the two resistors are unequal and a potential difference exists between the base 14 and collector 17 of a polarity to reverse-bias the collector 17 with respect to the base 14. In like manner it will be noted that the collector 33 of transistor 32 is directly connected to lead 20, whereas the base 31 of transistor 32 is connected to lead 20 through the resistor 19 across which a voltage drop occurs while the transistor 15 is drawing substantial current. This provides for a potential difference between base 31 and collector 33 of a polarity to reverse-bias the collector 33 with respect to the base 31.

As will be readily understood, substantial capacitance exists between the collector and base of transistors 15 and 32 notwithstanding the fact that the transistors are conducting. In accordance with the geometry of a transistor, the two elements in question provide for distributed resistance and distributed capacitance in the transistor device itself between these two elements. Capacitance may also exist between the base and emitter.

In a copending patent application Serial No. 80,877, filed January 5, 1961, now abandoned, by Barditch and Fogle entitled, "Delay Cable Tuned Semiconductor Amplifier Suitable for Partial Molecularization," and assigned to the assignee of the instant application, there is described a tuned amplifier in which an input signal is applied to a first transistor which shifts the signal in phase 180°; the signal is thereafter shifted in an especially designed frequency sensitive phase shifting device an additional 180° and applied by way of an emitter-follower transistor as a feedback signal to the input of the first transistor, no substantial additional phase shift taking place in the emitter follower transistor. Accordingly, in the circuit of the copending patent application, positive feedback is provided for signals of a certain frequency, because of the total 360° phase shift in the closed loop, and these signals are built up, while phase shifts of less or more than 360 degrees occur for signals of other frequencies with the result that the feedback signal arriving at the input of the first transistor is not in precise phase to provide maximum positive feedback, and off-frequency signals are thereby in effect attenuated, the entire circuit providing in effect a tuned amplifier circuit. The output is taken from the emitter of the emitter follower transistor.

In FIG. 1 presently under consideration, by suitable choice of component geometry, frequency, and potentials it may be arranged so that the total phase shift in the two transistors 15 and 32 is of desired amount (360°) to provide positive feedback for a certain frequency, and to provide the effect of a tuned amplifier, said feedback being applied by way of lead 35, potentiometer arm 38, and capacitor 39 to the aforementioned base 14 of transistor 15. The "tuning" frequency is determined in large part by the values of the collector capacitance of the two transistors. Since these capacitances are a function of the collector-to-base potential difference, the "tuning" point may be varied by adjusting the collector biases within the transistor operating range.

Figure 3:
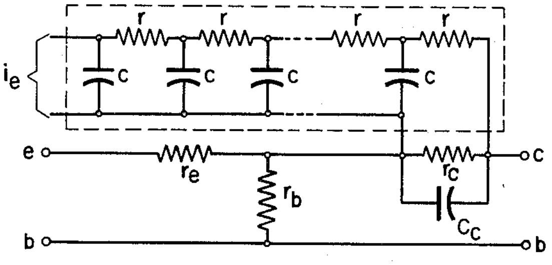
FIG. 3 is an equivalent circuit diagram of the circuits of FIGS. 1 and 2.
Figure 4:
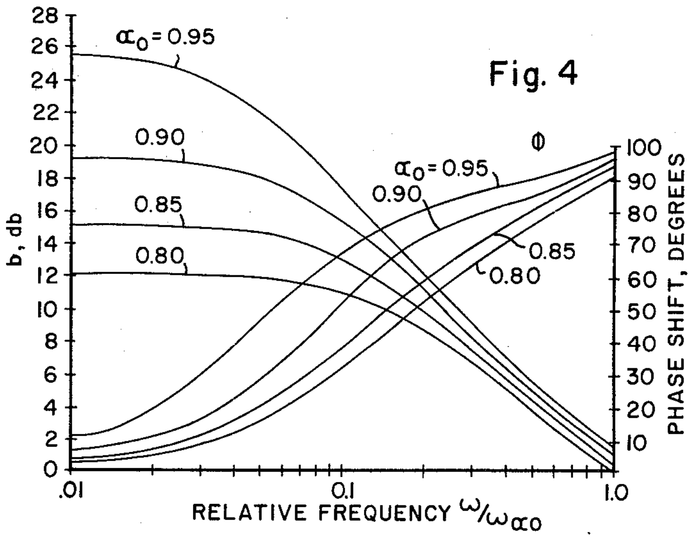
FIG. 4 is a graph illustrating the operation of the apparatus or devices of FIGS. 1 and 2.

For a fuller understanding of the phase shifts in transistors resulting from high frequency effects, reference may be had to a work entitled, "Principles of Transistor Circuits," edited by R. F. Shea, John Wiley & Sons, Inc., 1953. The graphs of FIGS. 3 and 4 are similar to FIG. 9.18, page 201; and FIG. 12.12, p. 262 of the text respectively. FIG. 3, the equivalent circuit of a transistor, shows that at high frequencies a junction transistor acts very much like a transmission line with distributed R and distributed C, providing in-line phase shifts. In FIG. 4, variations in phase shift and relevant current amplification ($b$) as a function of frequency, for various values of $\omega$, for an exemplificative transistor are shown. The phase shifts of FIG. 4 are in addition to the normal 180° phase shift resulting from the grounded emitter configuration of transistor 15.

A phase shift of approximately 270° may occur in transistor 15, and a phase shift due to high frequency effects of 90° may occur in transistor 32, notwithstanding the emitter-follower circuit configuration. It is apparent then, that for signals of a certain frequency, at input terminal 9 in lead 13, FIG. 1, a feedback loop phase shift of 360° may be obtained.

A user of the invention, in constructing a tuned amplifier according to FIG. 1, may proceed in one or more of several ways:

(1) He may obtain sufficiently detailed information on one or more types of transistors, including that type of information revealed in FIG. 4, to select transistors which would provide a total of 360° phase shift for signals of the frequency which he desired to amplify;

(2) He may himself measure the phase shift vs. frequency characteristics of a number of transistors, using well known measuring techniques, and make a transistor selection based on his own measurements; or (3) Where it is not necessary that the amplifier be "tuned" to a certain preselected frequency, he may select two transistors, and with no signal from source 10 increase the feedback by adjusting the position of potentiometer arm 38 until oscillations are produced, and thereafter "back away" until oscillations cease. The device is then in condition to amplify signals at a certain frequency, at or not far removed from the frequency at which oscillations were produced, which latter frequency can be easily ascertained by measurement.

Reference may also be had to the aforementioned text, pages 347–348 for polar plots showing the frequency dependence of transistor parameters at high frequencies.

A study of these polar plots reveals that phase shifts of several hundred degrees could occur in a transistor under certain conditions.

In ascertaining probable phase shift in a transistor, the effect of "$b$" may be taken into consideration.

The device or circuit of FIG. 2 may be used for the generation of oscillations by increasing the value of the feedback to a point whereat the circuit breaks into oscillations, the general requirement for the production of oscillations being the well known requirement that energy be fed back in proper phase relationship, and that the circuit must provide for overcoming the losses therein, as by sufficient amplification.

It has been found that the circuits will operate satisfactorily using a pair of transistors known in the trade as Type 2N384, with oscillation occurring at approximately 30 megacycles. The isolation capacitor 39, which may have a value of 270 micromicrofarads, may be eliminated if the two transistors 15 and 32 are separately biased, in a manner which will be readily understood by those skilled in the art.

It will be noted that the capacitor 39 is not used in providing any of the 360° phase shift needed; above a certain capacitance value a further increase in the capacity of capacitor 39 does not make any difference in the phase, and this capacitor is provided for D.C. isolation only.

The arm 38 of the potentiometer may provide some frequency adjustment, and also affects the loading and hence may have the effect of varying what may be called the "Q" of the circuit.

In the claims apended hereto, it should be understood that such terms as "transistor," "capacitor," "resistor," "lead" may refer to suitably doped regions in a single block of semiconductor material.

Whereas the invention has been shown and described with respect to some embodiments thereof which give satisfactory results, it should be understood that changes may be made and equivalents substituted without departing from the spirit and scope of the invention.

We claim as our invention:

1. A semiconductor tuned amplifier comprising, in combination, transistor means having an input signal to be amplified applied thereto, said transistor means having base, collector and emitter regions and being connected in a common emitter configuration, said input signal being applied to said base, energizing and biasing means connected to the transistor means for energizing the transistor means and biasing the base with respect to said collector whereby the base-collector junction is reverse-biased, the semiconductor regions and their junctions providing distributed resistance and capacitance phase shift networks, said transistor means shifting the phase of the input signal by an amount due to inherent electrical phase relations in a common emitter transistor and an additional amount due to the distributed resistance and capacitance of the collector base junction, other transistor means including a base, collector and emitter, said other transistor means being connected as an emitter follower, the collector of said first-named transistor means being directlly connected to the base of the other transistor means, means for reverse-biasing the base of the other transistor means with respect to the collector of the other transistor means, an additional signal phase shift occurring in the other transistor means due to the distributed resistance capacitance network inherent in said transistor means, the phase shift in the first-named transistor means and the additional phase shift in the other transistor means totaling substantially 360° for signals of a selected frequency, said selected frequency being a function of the equivalent inherent distributed resistance-capacitance network of the first-named transistor means and said other transistor means, signal feedback circuit means including D.C. isolation means connecting the emitter of said other transistor means to the base of the first named transistor means for applying at least a portion of the output of the other transistor means as a positive feedback signal to the base of the first-named transistor means, and output means connected to the other transistor means.

2. A semiconductor tuned amplifier comprising, in combination, a first transistor having a collector, base and emitter and connected in a common emitter configuration, a coupling resistor connected in the collector circuit of the first transistor, means including said coupling resistor for biasing the base of the first transistor with respect to the collector whereby a reverse-biased junction is created between the base and collector of the first transistor, means connected to the first transistor for applying a signal to be amplified to said base, a second transistor having a base, collector and emitter and connected in an emitter follower configuration, the base of the second transistor being directly connected to the collector of the first transistor, output means connected to the emitter of the second transistor, and signal feedback circuit means including D.C. isolation means connecting the emitter of the second transistor to the base of the first transistor, the first transistor providing a phase shift in the input signal applied by an amount due to the inherent electrical phase relations in a common emitter transistor and an additional amount due to the equivalent distributed resistance-capacitance network inherent in said first transistor means, the second transistor providing an additional phase shift in the signal applied thereto due to the equivalent distributed resistance-capacitance network inherent in said second transistor means, the total phase shift in both said transistor means being substantially 360° for signals of a selected frequency whereby positive feedback is provided for signals of said selected frequency.

3. A semiconductor tuned amplifier circuit comprising, in combination, a first transistor having a collector, base and emitter and connected in a common emitter configuration, said emitter being connected to a common circuit point, a source of direct current biasing and energizing potential having one terminal connected to said common circuit point, first resistor means connecting said collector to the other terminal of said source of direct current potential, second resistor means connecting said base to said other terminal whereby said base is biased with respect to said collector and a reverse-biased p-n junction exists between the base and collector of the first transistor, a second transistor having a collector, base and emitter, the collector of the second transistor being connected to said other terminal of said source of direct current potential, said second transistor being connected as an emitter follower, the base of the second transistor being directly connected to the collector of the first transistor, and signal feedback circuit means including D.C. isolation means connecting the emitter of the second transistor to the base of the first transistor, and output circuit means connected to the emitter of the second transistor, the phase shift in the first and second transistors being that due to the inherent electrical phase relation in said first transistor operating in a common emitter transistor plus that due to the equivalent distributed resistance-capacitance networks inherent in said transistors for signals of a selected frequency whereby positive feedback is applied to the base of the first transistor.

4. A semiconductor signal translation system comprising, first transistor means having a base, collector and an emitter and being connected in a common emitter configuration, input signal means connected to the base of said first transistor means, second transistor means having a base, collector and emitter and connected in an emitter-follower configuration, the base of said second transistor means being directly connected to the collector of said first transistor means, means for energizing and reverse biasing the respective collector-base junctions of said first and second transistor means, said transistor means providing equivalent distributed resistance-capacitance phase shift networks, signal feedback circuit means including D.C. isolation means connecting the emitter circuit of said second transistor means to the base of said first transistor means for applying at least a portion of the output of said second transistor means to the base of said first transistor means, and output means connected to said second transistor means, said first transistor means shifting the phase in the input signal applied to its base by an amount due to the electrical phase relations of a common emitter transistor plus an additional phase shift due to the equivalent distributed resistance-capacitance networks inherent in said transistor means, said second transistor means producing an additional phase shift due to the equivalent distributed resistance-capacitance network inherent in said second transistor means, the total phase shift between the base of said first transistor means and the output emitter circuit of said second transistor being 360° for selected frequencies whereby regenerative feedback through said feedback circuit produces a band pass characteristic.

5. A semiconductor signal translation system comprising, first transistor means having base, collector and emitter regions and being connected in a common emitter configuration, input signal means connected to the base of said first transistor means, said second transistor means having base, collector and emitter regions and being connected in an emitter-follower configuration, the base of said second transistor means being directly connected to the collector of said first transistor means, means for energizing and reverse biasing the respective collector-base junctions of said first and second transistor means, the semiconductor regions and their junctions providing distributed resistance and capacitance phase shift networks, adjustable signal feedback circuit means including D.C. isolation means connecting the emitter circuit of said second transistor means to the base of said first transistor means for applying at least a portion of the output of said second transistor means to the base of said first transistor means, and output means connected to said second transistor means, said first transistor means shifting the phase of the input signal applied to its base by an amount due to the electrical phase relations of a common emitter transistor plus an additional phase shift due to the equivalent distributed resistance and capacitance of the semiconductor and their junctions, said second transistor means producing an additional phase shift due to the distributed resistance and capacitance of its semiconductor regions, the total phase shift between the base of said first transistor means and the output emitter circuit of said second transistor being 360° for selected frequencies whereby regenerative feedback through said feedback circuit produces a band pass characteristic.

References Cited by the Examiner

UNITED STATES PATENTS

| | | | |
|---|---|---|---|
| 2,751,501 | 6/1956 | Eberhard | 331—108 |
| 2,762,875 | 9/1956 | Fischer | 330—19 |
| 2,816,228 | 12/1957 | Johnson | 331—108 |
| 3,025,472 | 3/1962 | Greatbatch | 330—25 X |
| 3,040,264 | 6/1962 | Weidner | 330—25 |
| 3,070,762 | 12/1962 | Evans. | |
| 3,107,331 | 10/1963 | Barditch et al. | |
| 3,136,848 | 6/1964 | Woodworth | 330—28 X |

OTHER REFERENCES

Text: Basic Theory and Application of Transistors, Dept. of the Army Technical Manual, March 1959.

Text: Principles of Transistor Circuits, R. F. Shea, John Wiley & Sons, Inc., 1953.

ROY LAKE, *Primary Examiner.*

JOHN KOMINSKI, NATHAN KAUFMAN, *Examiners.*

F. D. PARIS, *Assistant Examiner.*